US011756804B2

(12) United States Patent
Gadgil et al.

(10) Patent No.: US 11,756,804 B2
(45) Date of Patent: Sep. 12, 2023

(54) PLATEN SHIELD CLEANING SYSTEM

(71) Applicant: Applied Materials, Inc., Santa Clara, CA (US)

(72) Inventors: Shantanu Rajiv Gadgil, Santa Clara, CA (US); Sumit Subhash Patankar, Fremont, CA (US); Nathan Arron Davis, Gilbert, AZ (US); Allen L. D'Ambra, Burlingame, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 18/091,309

(22) Filed: Dec. 29, 2022

(65) Prior Publication Data
US 2023/0146929 A1 May 11, 2023

Related U.S. Application Data

(62) Division of application No. 16/909,947, filed on Jun. 23, 2020, now Pat. No. 11,545,371.

(51) Int. Cl.
| | |
|---|---|
| *B08B 1/04* | (2006.01) |
| *B24B 37/34* | (2012.01) |
| *H01L 21/67* | (2006.01) |
| *B24B 37/27* | (2012.01) |
| *B08B 3/00* | (2006.01) |

(Continued)

(52) U.S. Cl.
CPC ............... *B08B 1/04* (2013.01); *B08B 3/003* (2013.01); *B24B 37/27* (2013.01); *B24B 37/34* (2013.01); *H01L 21/6704* (2013.01); *B24B 37/12* (2013.01); *B24B 55/04* (2013.01);
(Continued)

(58) Field of Classification Search
CPC . B24B 37/00–345; B24B 37/10; B24B 37/34; B24B 37/04–044; B24B 37/27–30; B24B 37/12–16; B24B 55/04–057; B24B 57/00; B24B 57/02; B24B 1/00–57/04; H01L 21/00–86;
(Continued)

(56) References Cited

U.S. PATENT DOCUMENTS

| | | |
|---|---|---|
| 5,738,574 A | 4/1998 | Tolles et al. |
| 6,206,760 B1 | 3/2001 | Chang et al. |

(Continued)

FOREIGN PATENT DOCUMENTS

| | | |
|---|---|---|
| CN | 104985523 | 10/2015 |
| JP | 2000-263417 | 9/2000 |

(Continued)

OTHER PUBLICATIONS

"Adapter, n." OED Online (Oxford University Press, 2023), retrieved from www.oed.com/view/Entry/2121. (Year: 2023).*
"Holder, n.1." OED Online (Oxford University Press, 2023), retrieved from www.oed.com/view/Entry/87697. (Year: 2023).*
International Search Report and Written Opinion in International Appln. No. PCT/US2021/038296, dated Oct. 2, 2021, 8 pages.
Office Action in Taiwanese Appln. No. 110122936, dated Mar. 24, 2022, 4 pages (with English search report).

*Primary Examiner* — Mikhail Kornakov
*Assistant Examiner* — Richard Z. Zhang
(74) *Attorney, Agent, or Firm* — Fish & Richardson P.C.

(57) ABSTRACT

In a chemical mechanical polishing system, a platen shield cleaning assembly is installed on a rotatable platen in a gap between the rotatable platen and a platen shield. The assembly includes a sponge holder attached to the platen and a sponge. The sponge is held by the sponge holder such that an outer surface of the sponge is pressed against an inner surface of the platen shield.

14 Claims, 6 Drawing Sheets

(51) Int. Cl.
  *B24B 37/12* (2012.01)
  *B24B 57/00* (2006.01)
  *H01L 21/306* (2006.01)
  *B24B 55/04* (2006.01)
  *H01L 21/304* (2006.01)

(52) U.S. Cl.
  CPC ............. *B24B 57/00* (2013.01); *H01L 21/304* (2013.01); *H01L 21/30625* (2013.01)

(58) Field of Classification Search
  CPC ............. H01L 21/304; H01L 21/30625; B08B 1/00–04
  USPC ............................................ 134/6; 15/1–447
  See application file for complete search history.

(56) References Cited

U.S. PATENT DOCUMENTS

| | | |
|---|---|---|
| 11,545,371 B2 | 1/2023 | Gadgil et al. |
| 2019/0299360 A1 | 10/2019 | Sone et al. |
| 2021/0394540 A1 | 12/2021 | Gadgil et al. |

FOREIGN PATENT DOCUMENTS

| | | | |
|---|---|---|---|
| JP | 2001-319902 | | 11/2001 |
| JP | 2006-229100 | | 8/2006 |
| JP | 2010-201787 | | 9/2010 |
| KR | 20050063346 A | * | 6/2005 |

* cited by examiner

PLATEN SHIELD CLEANING SYSTEM

CROSS-REFERENCE TO RELATED APPLICATIONS

This application is a divisional application of U.S. application Ser. No. 16/909,947, filed on Jun. 23, 2020, the contents of which are hereby incorporated by reference.

TECHNICAL FIELD

The present disclosure relates to chemical mechanical polishing, and more particularly to cleaning of a shield that surrounds a platen.

BACKGROUND

An integrated circuit is typically formed on a substrate by the sequential deposition of conductive, semiconductive, or insulative layers on a silicon wafer. One fabrication step involves depositing a filler layer over a non-planar surface and planarizing the filler layer. For certain applications, the filler layer is planarized until the top surface of a patterned layer is exposed. A conductive filler layer, for example, can be deposited on a patterned insulative layer to fill the trenches or holes in the insulative layer. After planarization, the portions of the conductive layer remaining between the raised pattern of the insulative layer form vias, plugs, and lines that provide conductive paths between thin film circuits on the substrate. For other applications, such as oxide polishing, the filler layer is planarized until a predetermined thickness is left over the non planar surface. In addition, planarization of the substrate surface is usually required for photolithography.

Chemical mechanical polishing (CMP) is one accepted method of planarization. This planarization method typically requires that the substrate be mounted on a carrier or polishing head. The exposed surface of the substrate is typically placed against a rotating polishing pad. The carrier head provides a controllable load on the substrate to push it against the polishing pad. A polishing liquid is typically supplied to the surface of the polishing pad.

The polishing pad is typically supported on a rotatable platen. As the platen and polishing pad rotate, centrifugal force tends to urge the polishing liquid off the polishing pad. A platen shield can be placed around the platen to prevent the polishing liquid being thrown off the polishing pad from contaminating the work area.

SUMMARY

In one aspect, a platen shield cleaning system includes a platen shield cleaning assembly for cleaning a platen shield of a chemical mechanical polishing system. The platen shield cleaning assembly is installed on a rotatable platen in a gap between the rotatable platen and a platen shield. The assembly includes a sponge holder attached to the rotatable platen and a sponge. The sponge is held by the sponge holder such that an outer surface of the sponge is pressed against an inner surface of the platen shield.

Implementations may include one or more of the following features.

The sponge holder may include an adapter configured to be removably secured to the rotatable platen. The adapter is configured to press the sponge against the inner surface of the platen shield. The adapter may include a latch configured to be removably secured to a plug extending from a platen.

The sponge may be pressed against an inner surface of the platen shield by a plurality of springs.

The sponge holder may include a latch and a backing piece. The latch may be configured to be removably secured to a plug extending from a platen. The backing piece is connected to the latch and having an outer surface configured to receive a sponge. The outer surface is curved so as to conform the sponge to a platen shield inner surface profile. The sponge may be attached to the outer surface of the sponge holder by a hook and loop fixture. The sponge holder may be coupled to the backing piece by multiple springs. The springs may be coupled to the backing piece and the sponge holder by a plurality of fasteners.

The platen shield cleaning system may include an adapter and a sponge holder. The adapter may be configured to be removably secured to a platen of a chemical mechanical polishing system. The sponge holder may be connected to the adapter and having an outer surface configured to receive a sponge and hold the sponge against an inner surface of a platen shield that surrounds the platen. The adapter may include a latch configured to be removably secured to a plug extending from a platen. The adapter may include a support flange configured to abut a top surface of the platen to prevent the adapter from rotating.

The platen shield cleaning system may include multiple springs interposed between the adapter and the sponge holder to urge the sponge into contact with the inner surface of the platen shield. Multiple cotter pins may hold the springs to the adapter and the sponge holder.

The platen shield cleaning system may include a sponge coupled to the sponge holder. The sponge may be couple to the sponge holder by a loop and hook fixture. The sponge may a dry sponge. The sponge may be a wet sponge.

In another aspect, a method of cleaning a platen shield includes installing a sponge and a sponge holder in a gap between a platen and a platen shield, urging the sponge into contact with the platen shield, and rotating the platen and the platen, the sponge holder, and the sponge while the sponge is in contact with the platen shield.

Implementations may include one or more of the following features.

Installing the sponge and the sponge holder may include compressing multiple spring interposed between the sponge and the sponge holder to move the sponge and the sponge holder closer to each other and releasing the spring interposed between the sponge and the sponge holder to move the sponge and the sponge holder away from each other. Installing the sponge and the sponge holder may include placing a latch on the sponge holder over a plug on the platen. Installing the sponge and sponge holder may include placing a support flange configured to abut a top surface of the platen to prevent the adapter from rotating.

The platen shield may be scraped with a dry sponge. The platen shield may be moistened with a wet sponge containing a cleaning solution and the platen shield may be scraped with the wet sponge.

Implementations may optionally include, but are not limited to, one or more of the following advantages. Polishing quality may be improved, e.g., fewer scratches and defects are created by dried abrasive particles from polishing slurry buildup detaching from the platen shield during the polishing process. Additionally, the quantity of wafers scrapped due to defects can be reduced. Maintenance down time for the polishing system may be significantly decreased. This improves productivity of the polishing system and reduces operator time because less time is devoted to the platen shield cleaning process. Switching between different modes of cleaning (i.e. dry cleaning and wet cleaning) is easier. The cleaning process can be quickly modified by adjusting tool pressure engagement with the platen shield.

The details of one or more implementations are set forth in the accompanying drawings and the description below. Other aspects, features, and advantages will be apparent from the description and drawings, and from the claims.

BRIEF DESCRIPTION OF THE DRAWINGS

Like reference numbers and designations in the various drawings indicate like elements.

DETAILED DESCRIPTION

During chemical mechanical polishing, a polishing liquid, e.g., an abrasive polishing slurry, is supplied to the surface of the polishing pad. As the platen and polishing pad are rotated, the abrasive polishing, the polishing liquid is thrown off the platen. A platen shield placed around the platen can serve as a barrier to block the polishing liquid from contaminating the surrounding regions of the polishing system.

Although some of the polishing liquid will flow off the shield and can be collected in a basin, some of the polishing liquid can dry and build up on the platen shield. The build up of dried polishing liquid on the platen shield over time has multiple deleterious effects. For example, abrasive particles in the polishing liquid can form agglomerates which can be dislodged and return to the polishing surface, thus creating the danger of scratching and defects. A significant amount of non-productive time is required to clean the platen shield to prevent build-up of the dried polishing liquid.

A platen shield cleaning tool that can be easily attached to the platen and that does not require equipment dis-assembly can alleviate these deleterious effects.

Figure 1A:
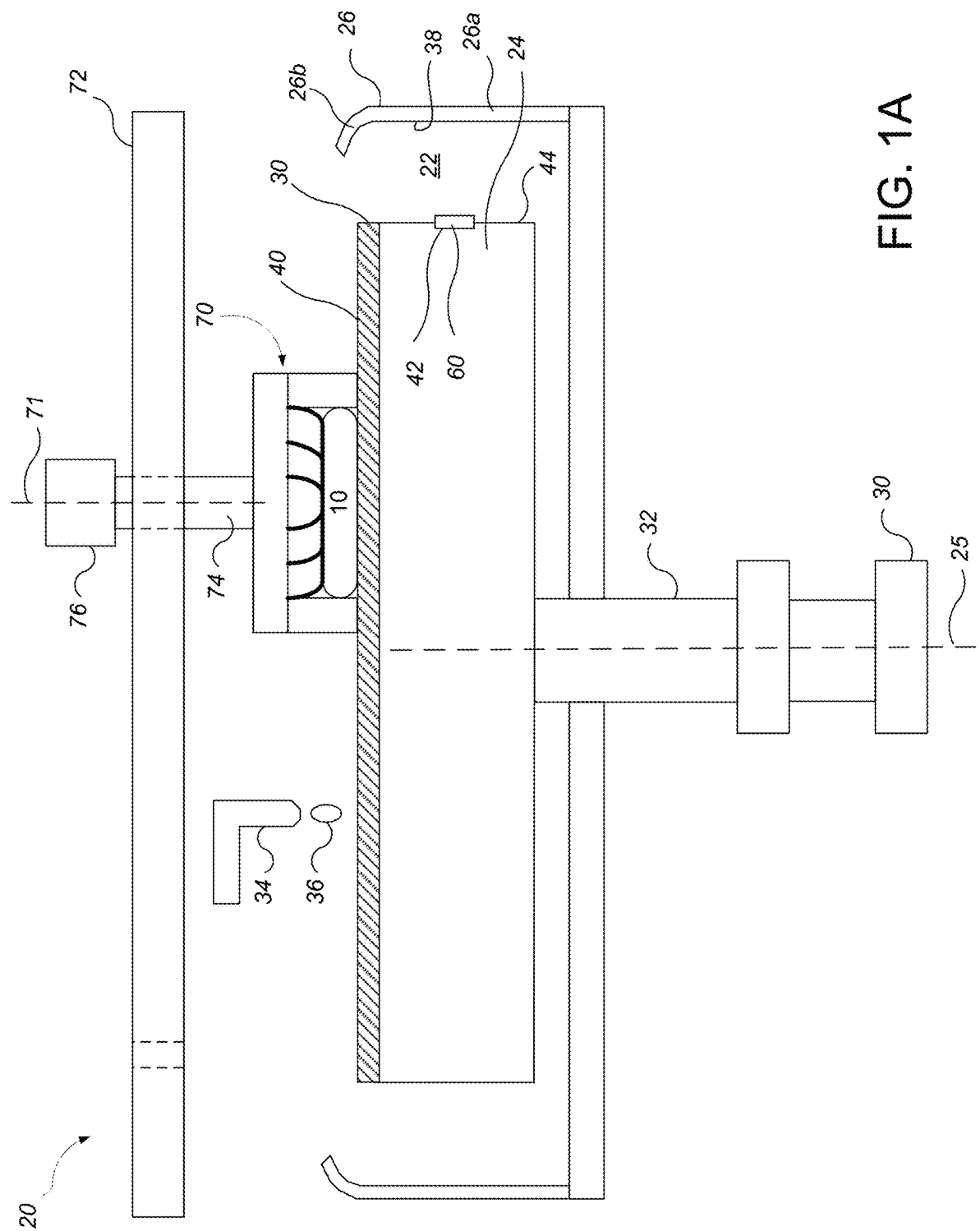
FIG. 1A shows a schematic cross-sectional view of a chemical mechanical polishing system.
Figure 1B:
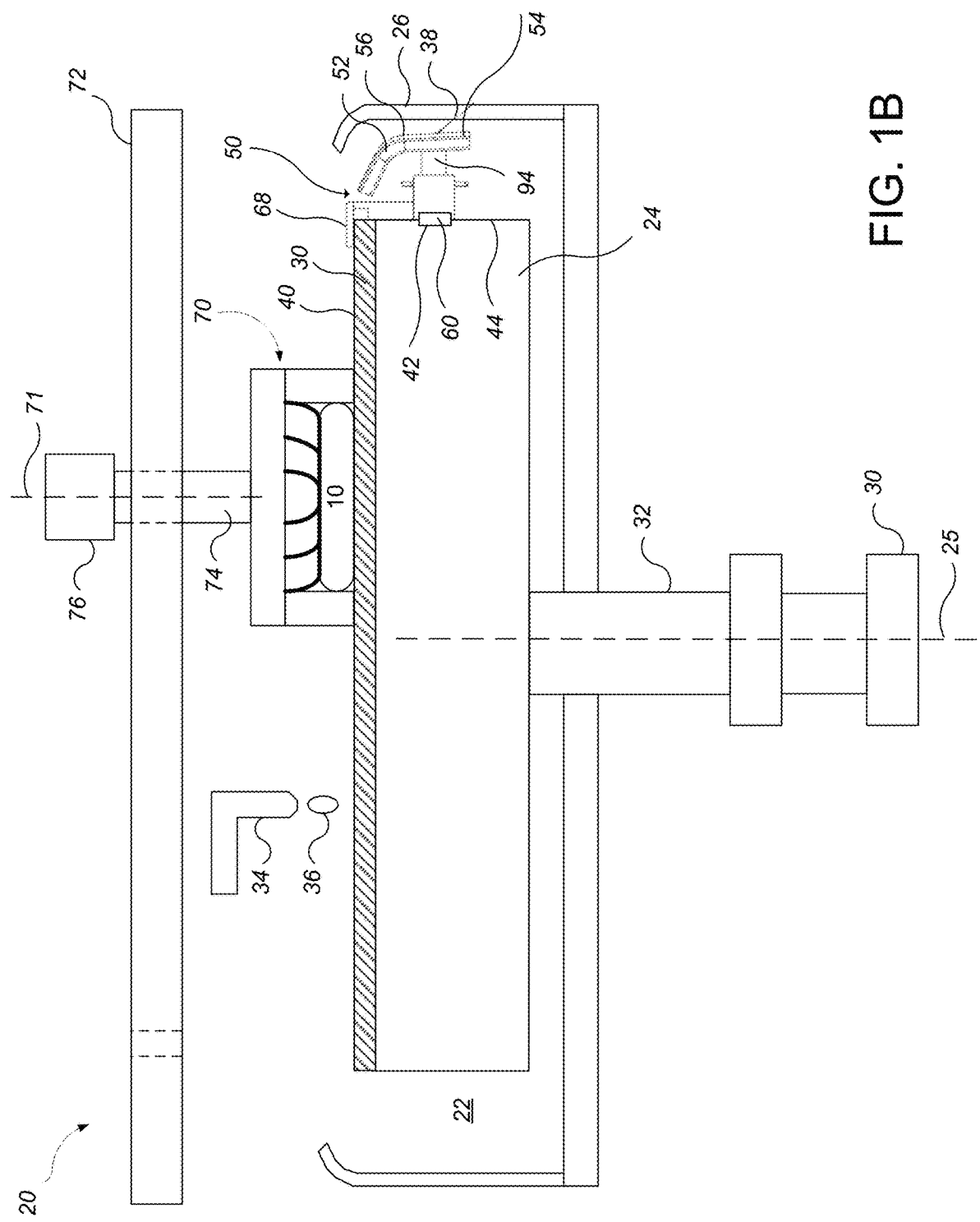
FIG. 1B shows a schematic cross-sectional view of a platen shield cleaning system installed on the chemical mechanical polishing system of FIG. 1.

FIG. 1A shows a polishing system 20 operable to polish a substrate 10. The polishing system 20 includes a rotatable platen 24, on which a main polishing pad 30 is situated and a platen shield 26 surrounding the rotatable platen 24 and separated from the platen 24 by an annular gap 22. As shown in FIG. 1B, a platen shield cleaning system 50 can be mechanically coupled to the rotatable platen 24 and interposed in between the rotatable platen 24 and the platen shield 26. The platen shield is circular and surrounds the rotatable platen 26. The platen shield can include a vertical cylindrical portion 26a, and the top of the platen shield can be curved inward to form a lip 26b. The lip 26b can be positioned above the vertical plane of the surface of the platen 24.

The rotatable platen 24 is operable to rotate about an axis 28. For example, a motor 30 can turn a drive shaft 32 to rotate the rotatable platen 24.

The polishing system 20 includes a carrier head 70 operable to hold the substrate 10 against the polishing pad 30. The carrier head 70 is suspended from a support structure 72, for example, a carousel or track, and is connected by a carrier drive shaft 74 to a carrier head rotation motor 76 so that the carrier head can rotate about an axis 71. In addition, the carrier head 70 can oscillate laterally across the polishing pad 30, e.g., by moving in a radial slot in the carousel 72 as driven by an actuator, by rotation of the carousel as driven by a motor, or movement back and forth along the track as driven by an actuator. In operation, the platen 24 is rotated about its central axis 25, and the carrier head is rotated about its central axis 71 and translated laterally across the top surface of the polishing pad 30.

The polishing system 20 can include a polishing liquid delivery arm 34. During polishing, the arm 34 is operable to dispense a polishing liquid 36. The polishing liquid 36 can be a slurry with abrasive particles. The polishing liquid 36 can be referred to by multiple names, e.g., abrasive polishing slurry, abrasive polishing liquid, or polishing slurry. Alternatively, the polishing system 20 can include a port in the platen 24 operable to dispense the polishing liquid 36 onto the main polishing pad 30. As the platen 24 is rotated, the abrasive polishing, the polishing liquid 36 is thrown off the platen 24. The platen shield 26 placed around the platen 24 can serve as a barrier to block the polishing liquid 36 from contaminating the surrounding regions of the polishing system 20. Although some of the polishing liquid 36 will flow off the platen shield 26 and can be collected below the polishing system 20, some of the polishing liquid 36 can build up on the platen shield 26. Subsequent polishing operations will continue to deposit polishing liquid 36 on the platen shield 26, and the polishing liquid 36 can dry and further accumulate on the platen shield 26.

A plug 60 is installed in a recess 42 in a cylindrical outside surface 44 of the platen 24. The plug 60 is removable from the recess 42. The plug 60 extends from the outside surface 44 into the gap 22. The plug can be a plastic or a metal. The plug 60 is configured to mechanically couple to the platen shield cleaning system 50 (shown in FIG. 2).

FIG. 1B shows a platen shield cleaning system 50 installed in the polishing system 20. The platen shield cleaning system 50 includes a sponge holder 52 and a sponge 54. The sponge holder 52 biases the sponge 54 against inside surface 38 of the platen shield 26 to clean the platen shield 26. The sponge 54 has an outer surface 56 that cleans the inside surface 38 of the platen shield 26.

The sponge 54 is made of a soft, porous, absorbent material. The sponge 54 can be made of a naturally occurring material or a synthetic material. For example, the sponge 54 can formed from naturally occurring material, such as vegetal cellulose, an animal sea sponge, hemp, or wood fiber. Alternatively, the sponge 54 can be formed from a synthetic material, such as polyester or polyurethane.

The sponge holder 52 is removably attached to the platen 24 and situated in the gap 22 between the platen 24 and the platen shield 26. The sponge 54 is removably attached to the sponge holder, e.g., by a weak adhesive layer coated on one surface of the sponge or by mechanical fasteners.

The sponge 54 is held by the sponge holder 52 such that an outer surface 56 of the sponge 54 is pressed against an inner surface 38 of the platen shield 24. In operation, the rotatable platen 24 and the platen shield cleaning system 50 rotate about the axis 28 with the sponge 54 engaging the inner surface 38 of the platen shield 26. The circular sweep of the sponge 54 around the inner surface 38 of the platen shield 26 can scrape off buildup of the polishing liquid 36.

A cleaning chemical can be applied to the sponge 54 to facilitate cleaning of the platen shield 26. A chemical can be applied to the sponge 54 to further prevent subsequent polishing liquid 36 buildup on the inner surface 38 of the platen shield 26. For example, de-ionized water, isopropyl alcohol, or potassium hydroxide can be applied to the sponge.

Figure 2:
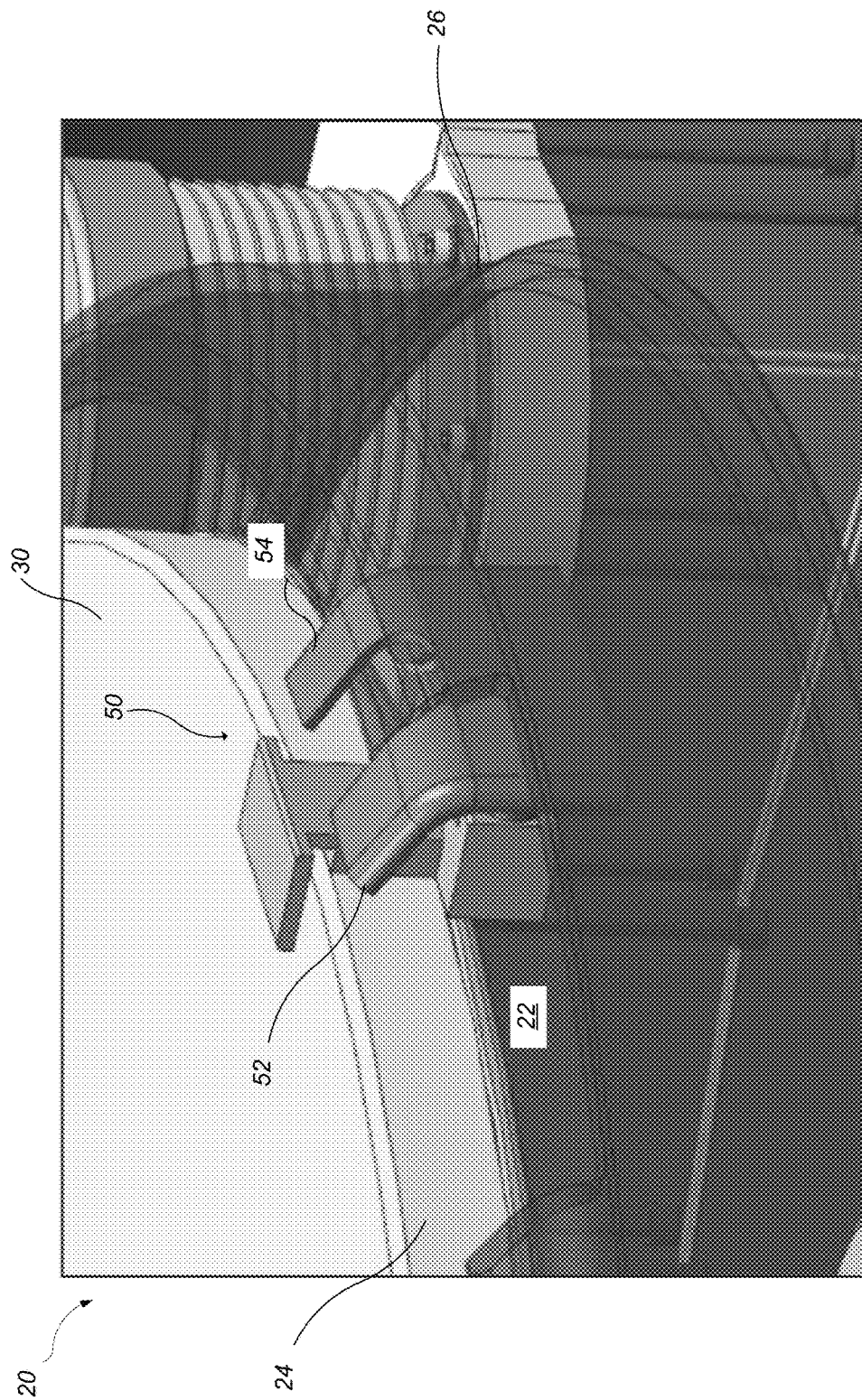
FIG. 2 shows a perspective view of the platen shield cleaning system of FIG. 2 installed on the chemical mechanical polishing system of FIG. 1.

FIG. 2 shows a perspective view of a platen shield cleaning system 50 installed in chemical mechanical polishing system 20. The platen shield cleaning system 50 is mechanically coupled to the rotatable platen 24 and interposed in between the rotatable platen 24 and the platen shield 26.

Figure 3:
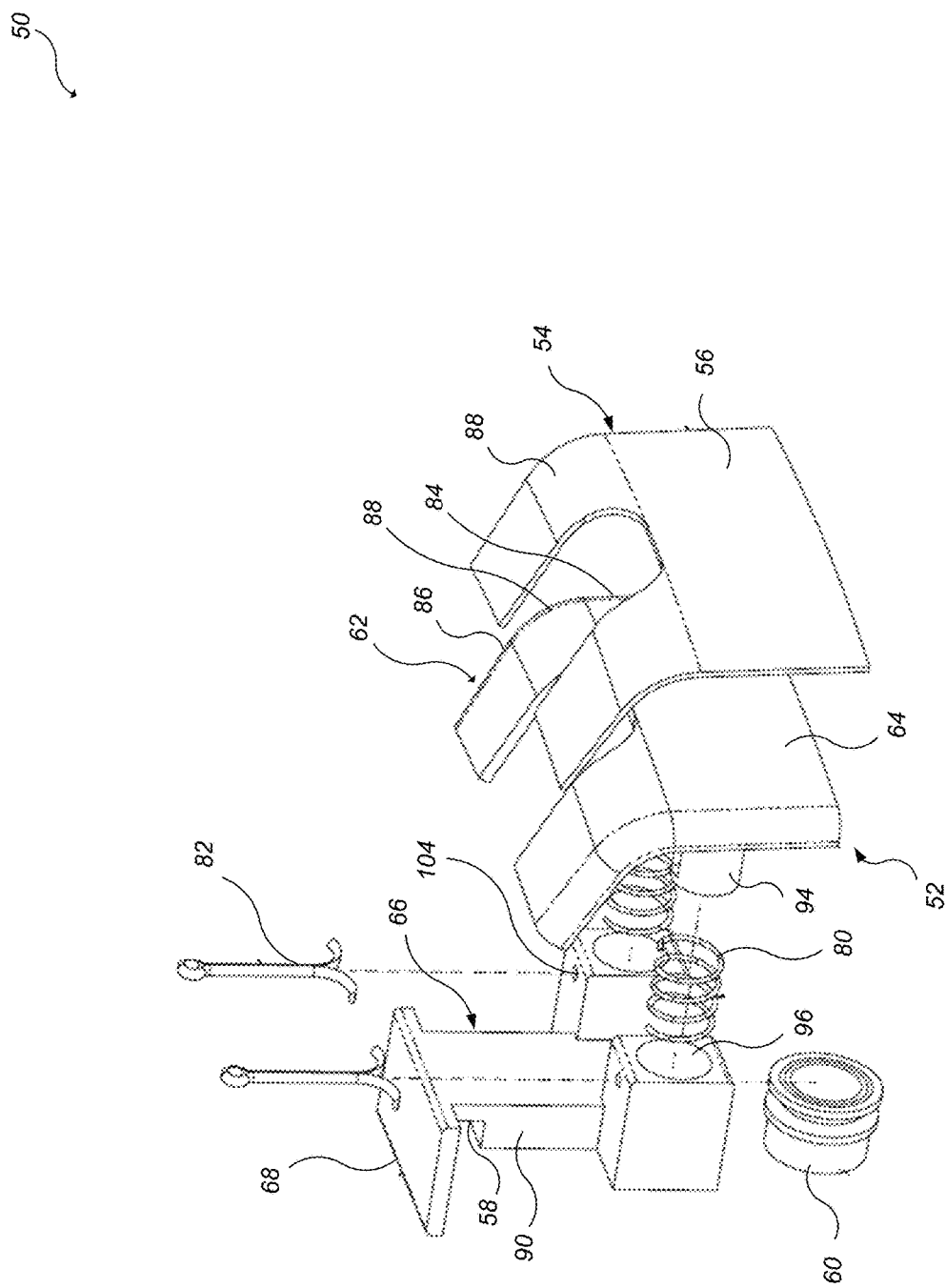
FIG. 3 shows an exploded front perspective view of the platen shield cleaning system of FIG. 2.
Figure 4:
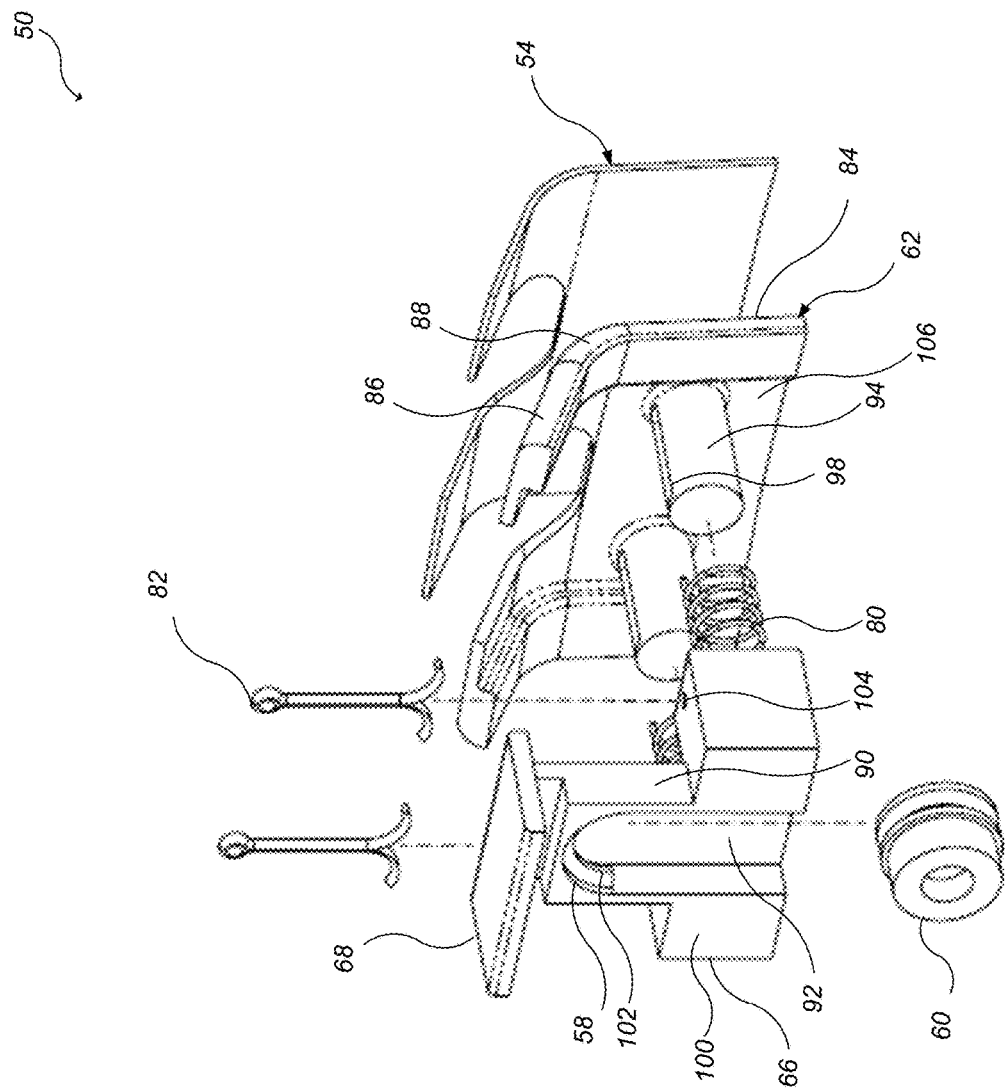
FIG. 4 shows an exploded rear perspective view of the platen shield cleaning system of FIG. 2.

FIG. 3 shows an exploded perspective view of the platen shield cleaning system 50 of FIG. 1. FIG. 4 shows a rear exploded perspective view of the platen shield cleaning system 50. Referring to FIGS. 1, 3 and 4, the platen shield cleaning system 50 includes an adapter 66 configured to be removably secured to the platen 24, and a sponge holder 52 with a backing piece 62 connected to the adapter 66 and having an outer surface 64 configured to receive the sponge 54.

The outer surface 64 of the backing piece 62 is curved so as to conform the sponge 54 to an inner surface 38 of the platen shield 26. The backing piece 62 can have a vertical section 84, an angled section 86, and a curved section 88 connecting the vertical section 84 to the angled section 86. This configuration conforms the sponge 54 to the vertical section 26a and inwardly curving lip 26b of the platen shield 26.

The sponge holder 52 includes a latching mechanism 58 to removably secure the sponge holder to the plug 60. For example, the rear face 100 of the adapter 66 adjacent the platen 24 can include a recess 92 into which the plug 60 can fit.

The adapter 66 includes a generally vertical main body 90 that will rest against the cylindrical outer surface of the platen, and a support flange 68 extending horizontally from a top edge of the main body 90 and configured to abut a top surface 40 of the pad or platen 24. The support flange 68 can prevent the adapter 66 from rotating under the effect of torque from the friction of the sponge against the platen shield. The adapter 66 has a rear face 100 with a recess 92. The recess 92 is configured to accommodate the plug 60. The recess 92 has a ridge 102 configured to latch onto the plug 60. The plug 60 slides vertically in the recess 92 until constrained by the ridge 102. Alternatively, the clamp could grab the platen 26 and the adapter 66 then secured to the clamp.

The main body 90 has voids 104 connected to the recesses 96. The voids 104 are sized to accommodate fastener 82.

The sponge holder 52 includes compression pins 94 protruding vertically from the rear surface 106. The compression pins 94 compress springs 80 into recesses 96 in the front face 102 of the adapter 66. The compression pins 94 can have vertical slits 98 that extend through the compression pins 94. The vertical slits 98 are sized to accommodate a fastener 82.

The sponge holder can made of a metal or a plastic. For example, the sponge holder can be steel, aluminum, high density polyethylene, or a composite.

The sponge 54 can be removably attached to the sponge holder 52 by a hook and loop fixture. One half of the hook and loop fixture is attached to the outer surface 64 by an adhesive. The other half of the hook and loop fixture is attached to the sponge 54 by an adhesive. The sponge 54 can be a dry sponge or a wet sponge. A dry sponge does not have any fluid chemicals added to the sponge. A wet sponge has a fluid added to the sponge. A wet sponge can be used to can be used to scrape off dry polishing liquid 36 buildup, soften and loosen dry polishing liquid 36 buildup, or to apply a chemical to the platen shield. For example, a chemical can be applied to the platen shield to reduce or prevent further dry polishing liquid 36 buildup. For example, a cleaning fluid can be added to the sponge.

The platen shield cleaning system 50 includes springs 80 interposed between the adapter 66 and the sponge holder 52 to urge the sponge 54 into contact with the inner surface 38 of the platen shield 26. The springs 80 fit into recesses 96 on the adapter 66. The springs 80 couple to the sponge holder 52 and are compressed by the compression pins 94. The springs 80 can be permanently attached or removably secured. The springs 80 can be permanently attached by welding or gluing, for example. The springs 80 can be removably secured by fasteners 82 like pins. For example, the fasteners 82 can be cotter pins. The platen shield cleaning system 50 can include fasteners 82 to hold the springs 80 to the adapter 66 and the sponge holder 52. The springs 80 are placed in the recesses 96 of the adapter 66. The sponge holder 54 compression pins 94 are coupled to the springs 80. A force is applied to the sponge holder 54 to compress the springs 80 into the recesses 96. The vertical slits 98 of the compression pins 94 are aligned with the voids 104 of the adapter 66. The cotter pins 82 are placed through the voids 104 and the vertical slits 98, capturing the springs 80.

In particular, to attach the adapter 66 to the platen 24, the plug 60 is aligned and placed inside the recess 42 in the cylindrical outside surface 44 of the platen 24. Then, the rear face 100 of the adapter 66 is aligned to the outside surface 44 of the platen 24. The adapter recess 92 is aligned to the plug 60. The adapter recess 92 is coupled to the recess 92. The adapter 66 vertically slides constrained by the plug 60 and the recess 92. The plug 60 contacts the ridge 102 of the latch mechanism 58. The adapter 66 is movement is constrained. The sponge holder 54 is released. The sponge holder 54 moves to a fully extended position.

Figure 5:
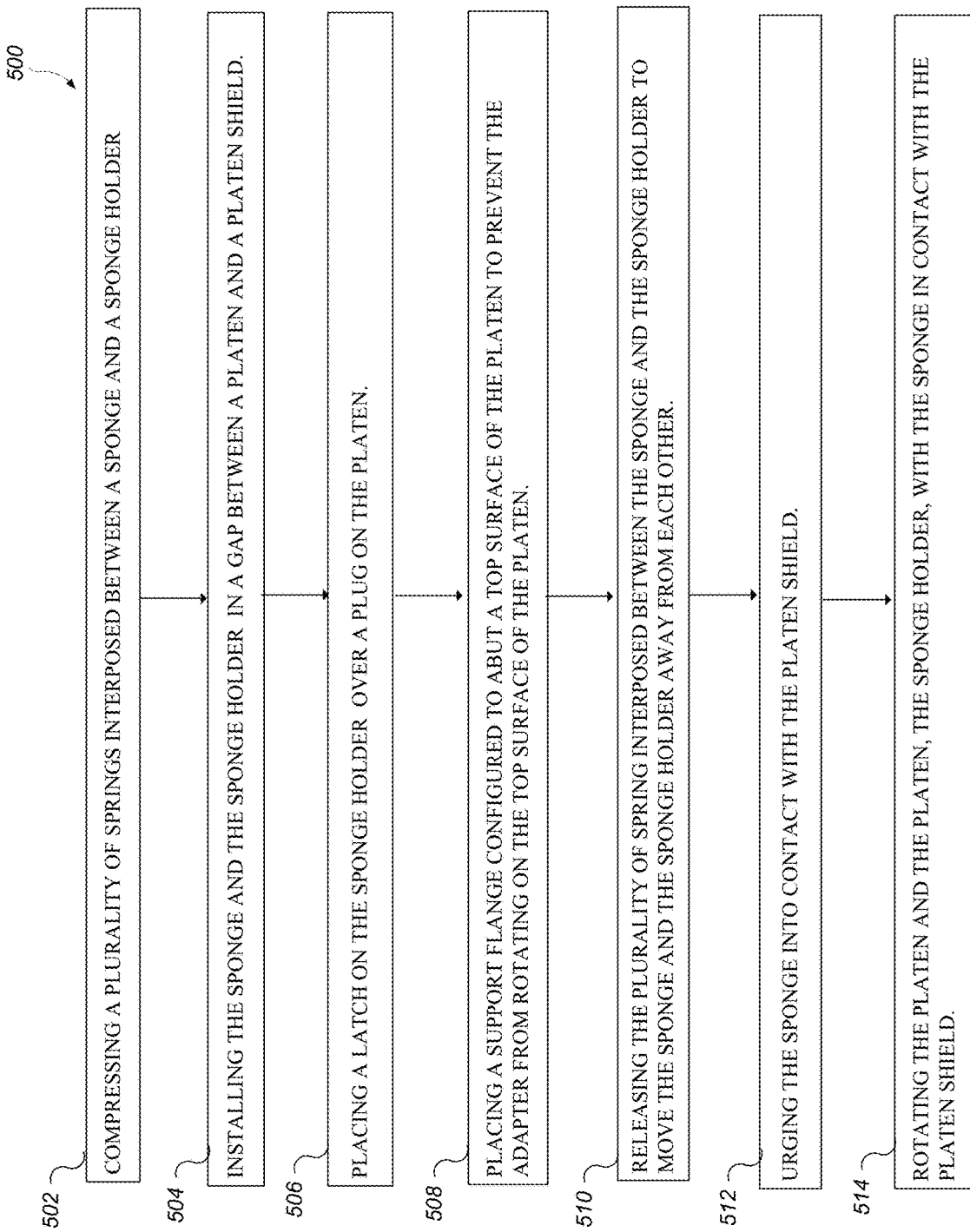
FIG. 5 shows a method of cleaning a platen shield.

FIG. 5 shows a method 500 of cleaning a platen shield. At 502, a plurality of springs interposed between a sponge and a sponge holder compress to move the sponge and the sponge holder closer to each other. At 504, the sponge and the sponge holder are installed in a gap between a platen and a platen shield. At 506, a latch on the sponge holder is placed over a plug on the platen. At 508, a support flange configured to abut a top surface of the platen to prevent the adapter from rotating is placed on the top surface of the platen. At 510, the plurality of spring interposed between the sponge and the sponge holder release to move the sponge and the sponge holder away from each other. At 512, the sponge is urged into contact with the platen shield. At 514, the platen and the platen, the sponge holder, with the sponge rotate in contact with the platen shield. The sponge can be a dry sponge or a wet sponge moistened with a liquid. The liquid can be a cleaning solution or a buildup prevention solution.

Particular embodiments of the subject matter have been described. Other embodiments are within the scope of the following claims.

What is claimed is:

1. An assembly comprising:
   a rotatable platen;
   a platen shield surrounding the rotatable platen and separated from the rotatable platen by a gap;
   an adapter configured to be removably secured to the rotatable platen;

a sponge holder attached to the adapter and situated in the gap; and a sponge held by the sponge holder such that an outer surface of the sponge is pressed by the adapter against an inner surface of the platen shield.

2. The assembly of claim 1, wherein the adapter further comprises a latch configured to be removably secured to a plug extending from the rotatable platen.

3. The assembly of claim 1, wherein the adapter further comprises a support flange configured to abut a top surface of the rotatable platen to prevent the adapter from rotating.

4. The assembly of claim 1, comprising a plurality of springs interposed between the adapter and the sponge holder to urge the sponge into contact with the inner surface of the platen shield.

5. The assembly of claim 4, comprising a plurality of cotter pins that hold the plurality of springs to the adapter and the sponge holder.

6. The assembly of claim 1, wherein the sponge is coupled to the sponge holder by a loop and hook fixture.

7. The assembly of claim 1, wherein the sponge is a dry sponge.

8. The assembly of claim 1, wherein the sponge is a wet sponge.

9. A platen shield cleaning method comprising:

installing a sponge on a sponge holder;

attaching the sponge holder to an adapter to form a cleaning tool;

removably securing the cleaning tool by the adapter to a platen in a gap between the platen and a platen shield;

urging the sponge into contact with an inner surface of the platen shield; and rotating the platen, the adapter, the sponge holder, and the sponge, with the sponge in contact with the platen shield.

10. The method of claim 9, wherein removably securing the cleaning tool by the adapter to the platen in the gap between the platen and the platen shield further comprises:

compressing a plurality of springs interposed between the adapter and the sponge holder to move the adapter and the sponge holder closer to each other; and releasing the plurality of springs to move the adapter and the sponge holder away from each other.

11. The method of claim 9, wherein removably securing the cleaning tool by the adapter to the platen in the gap between the platen and the platen shield further comprises placing a latch of the adapter over a plug on the platen.

12. The method of claim 9, wherein removably securing the cleaning tool by the adapter to the platen in the gap between the platen and the platen shield further comprises placing a support flange of the adapter to abut a top surface of the platen to prevent the adapter from rotating.

13. The method of claim 9, wherein the sponge comprises a dry sponge, and the method further comprises scraping the platen shield with the dry sponge.

14. The method of claim 9, further comprising: moistening the sponge with a cleaning solution to form a wet sponge; and scraping the platen shield with the wet sponge.

* * * * *